US011552164B2

(12) United States Patent
Jin et al.

(10) Patent No.: US 11,552,164 B2
(45) Date of Patent: Jan. 10, 2023

(54) SEMICONDUCTOR DEVICE AND MANUFACTURING METHOD THEREFOR

(71) Applicant: CSMC TECHNOLOGIES FAB2 CO., LTD., Wuxi (CN)

(72) Inventors: Huajun Jin, Wuxi (CN); Guipeng Sun, Wuxi (CN)

(73) Assignee: CSMC TECHNOLOGIES FAB2 CO., LTD., Wuxi (CN)

( * ) Notice: Subject to any disclaimer, the term of this patent is extended or adjusted under 35 U.S.C. 154(b) by 47 days.

(21) Appl. No.: 17/265,565

(22) PCT Filed: Aug. 9, 2019

(86) PCT No.: PCT/CN2019/099995
§ 371 (c)(1),
(2) Date: Feb. 3, 2021

(87) PCT Pub. No.: WO2020/030114
PCT Pub. Date: Feb. 13, 2020

(65) Prior Publication Data
US 2021/0242305 A1    Aug. 5, 2021

(30) Foreign Application Priority Data

Aug. 10, 2018 (CN) .......................... 201810914285.8

(51) Int. Cl.
*H01L 21/22* (2006.01)
*H01L 21/26* (2006.01)
(Continued)

(52) U.S. Cl.
CPC ........ *H01L 29/063* (2013.01); *H01L 21/2253* (2013.01); *H01L 21/266* (2013.01);
(Continued)

(58) Field of Classification Search
CPC ..... H01L 21/22; H01L 21/26; H01L 21/2253; H01L 21/26513; H01L 29/06;
(Continued)

(56) References Cited

U.S. PATENT DOCUMENTS 6,867,083 B2   3/2005   Imam et al.
8,981,474 B2   3/2015   Miura
(Continued)

FOREIGN PATENT DOCUMENTS

CN    101359687 A    2/2009
CN    106098774 A    11/2016
(Continued)

OTHER PUBLICATIONS

PCT International Search Report for corresponding PCT Application No. PCT/CN2019/099995, dated Nov. 5, 2019, 4 pages.
(Continued)

*Primary Examiner* — Fazli Erdem
(74) *Attorney, Agent, or Firm* — Dority & Manning, P.A.

(57) ABSTRACT

A semiconductor device comprises: a substrate; a well region provided in the substrate, having a second conductivity type; source regions having a first conductivity type; body tie regions having the second conductivity type, the source regions and the body tie regions being alternately arranged in a conductive channel width direction so as to form a first region extending along the conductive channel width direction, and a boundary where the edges of the source regions and the edges of the body tie regions are alternately arranged being formed on two sides of the first region; and a conductive auxiliary region having the first conductivity type, provided on at least one side of the first region, and directly contacting the boundary, a contact part
(Continued)

comprising the edge of at least one source region on the boundary and the edge of at least one body tie region on the boundary.

8 Claims, 7 Drawing Sheets

(51) Int. Cl.
    *H01L 29/06*     (2006.01)
    *H01L 21/225*     (2006.01)
    *H01L 21/265*     (2006.01)
    *H01L 21/266*     (2006.01)
    *H01L 29/10*     (2006.01)
    *H01L 29/66*     (2006.01)
    *H01L 29/78*     (2006.01)

(52) U.S. Cl.
    CPC .... *H01L 21/26513* (2013.01); *H01L 29/1095* (2013.01); *H01L 29/66681* (2013.01); *H01L 29/7816* (2013.01)

(58) Field of Classification Search
    CPC ... H01L 29/10; H01L 29/063; H01L 29/1095; H01L 29/66681; H01L 29/7816; H01L 29/66; H01L 29/78
    USPC .......................................................... 438/286
    See application file for complete search history.

(56) References Cited

U.S. PATENT DOCUMENTS 9,831,338 B1* 11/2017 Lin ..................... H01L 29/0692
2015/0187761 A1* 7/2015 Irsigler ............... H01L 29/4238
                                                                                 257/334

FOREIGN PATENT DOCUMENTS

CN       106981518 A     7/2017
JP       2012156205 A     8/2012

OTHER PUBLICATIONS

Chinese Office Action for corresponding CN Application No. 201810914285.8, dated May 31, 2021—7 pages.
Huijun Li, "Principles of Modern Integrated Circuit Manufacturing Process" (w/ English abstract), Feb. 28, 2007, pp. 163-166.
Yongsheng Tan, "Experiment for Integrated Circuit Process" (w/ English abstract), Apr. 30, 2015, pp. 6-8.
Min Shi, "Physics and Processes of Semiconductor Devices," 3$^{rd}$ edition (w/ English abstract), Apr. 30, 2014, pp. 418-423.

* cited by examiner

SEMICONDUCTOR DEVICE AND MANUFACTURING METHOD THEREFOR

TECHNICAL FIELD

The present disclosure relates to a field of semiconductor manufacturing, in particular, to a semiconductor device, and further to a method for manufacturing the semiconductor device.

BACKGROUND

A source region and a body lead-out region of a semiconductor device can be provided in a well region. A conventional configuration is that the source region and the body lead-out region are in a shape of strip extending along a width direction of a conductive channel, so as to be arranged in a length direction of the conductive channel, however, such configuration will cause a relatively large size of the device in the length direction of the conductive channel.

SUMMARY

Accordingly, it is necessary to provide a semiconductor device and a method for manufacturing the same.

A semiconductor device includes: a substrate; a well region provided in the substrate, and having a second conductivity type; a source region provided in the well region and having a first conductivity type opposite to the second conductivity type; a body lead-out region provided in the well region, and having the second conductivity type, wherein the source regions and the body lead-out regions are alternately arranged in a width direction of a conductive channel, so as to form a first region extending along the width direction of the conductive channel, both sides of the first region are boundaries formed by alternately arranging edges of the source regions and edges of the body lead-out regions; and a conductive auxiliary region having the first conductivity type, provided on at least one side of the first region, the conductive auxiliary region being in direct contact with the boundary, wherein a contacting portion includes at least one edge of the source region on the boundary and at least one edge of the body lead-out region on the boundary.

A method for manufacturing a semiconductor device includes forming a well region implantation window on a substrate by photoetching; implanting ions of a first conductivity type and ions of a second conductivity type into the substrate through the well region implantation window, wherein the first conductivity type is opposite to the second conductivity type; performing a thermal diffusion such that the implanted ions of the second conductivity type forms a well region, and the implanted ions of the first conductivity type forms a second region; and forming a source region and a body lead-out region in the well region. The source regions and the body lead-out regions are alternately arranged in a width direction of a conductive channel, so as to form a first region extending along the width direction of the conductive channel. Both sides of the first region are boundaries formed by alternately arranging edges of the source regions and edges of the body lead-out regions. The first region overlaps a part of the second region. A portion of the second region located outside the first region is used as a conductive auxiliary region. A portion of the conductive auxiliary region in direct contact with the boundary includes at least one edge of the source region on the boundary and at least one edge of the body lead-out region on the boundary.

Details of one or more embodiments of the present application are set forth in the following drawings and description. Other features, objects and advantages of the present application will become apparent from the description, drawings and claims.

BRIEF DESCRIPTION OF THE DRAWINGS

In order to better describe and illustrate embodiments and/or examples of those inventions disclosed herein, reference may be made to one or more figures. Additional details or examples used to describe the drawings should not be considered as limiting the scope of any of the disclosed inventions, the currently described embodiments and/or examples, and the best mode of these inventions currently understood.

DETAILED DESCRIPTION OF THE EMBODIMENTS

Figure 1:
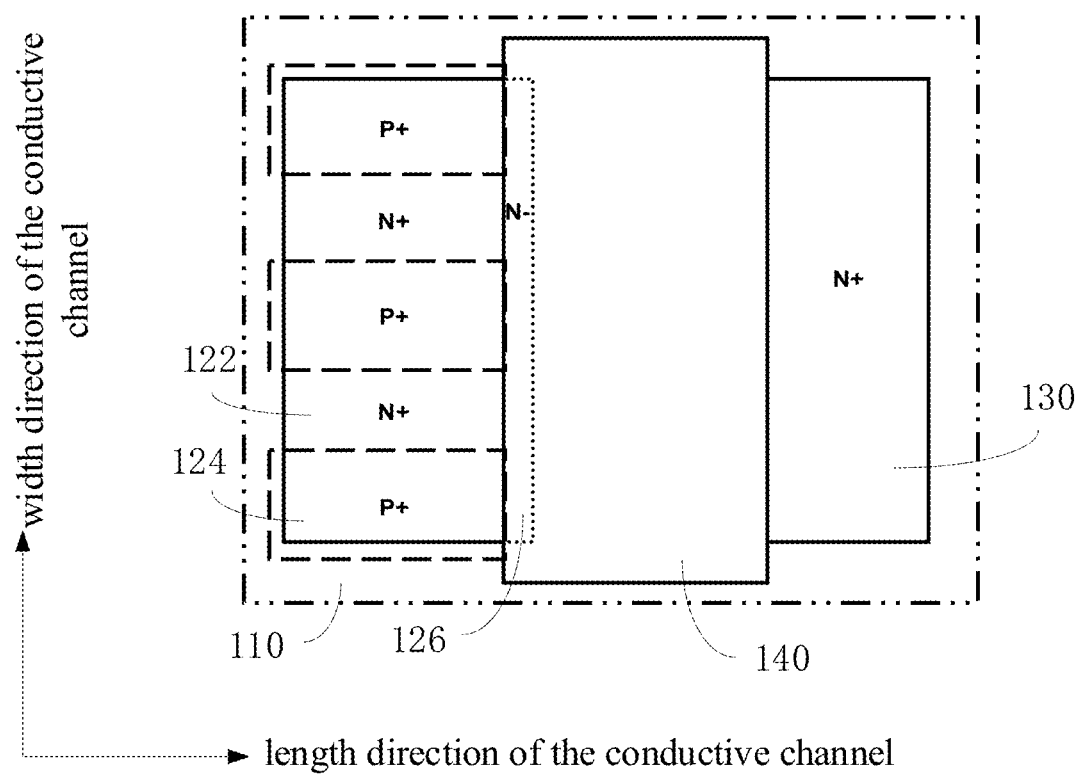
FIG. 1 is a schematic planar view of a semiconductor device in an embodiment.

In order to facilitate the understanding of the present disclosure, the present disclosure will be described more fully below with reference to relevant attached drawings. Preferred embodiments of the present disclosure are illustrated in the drawings. However, the present disclosure can be implemented in many different forms and is not limited to the embodiments described herein. On the contrary, providing these embodiments is to assist understanding the content disclosed by the present disclosure more fully and thoroughly.

Unless otherwise defined, all technical and scientific terms used herein have the same meaning as commonly understood by those skilled in the technical field of the present disclosure. The terms used in the specification of the present disclosure herein are only for the purpose of describing specific embodiments, and are not intended to limit the present disclosure. The term "and/or" as used herein includes any and all combinations of one or more related listed items.

Terms related to a semiconductor field used herein are technical terms commonly used by those skilled in the art. For example, for P type and N type impurities, in order to distinguish a doping concentration, a P+ type simply represents a P type with heavy doping concentration, a P type represents a P type with medium doping concentration, a P− type represents a P type with light doping concentration, a N+ type represents a N type with heavy doping concentration, a N type represents a N type with medium doping concentration, and a N− type represents a N type with light doping concentration.

Figure 2:
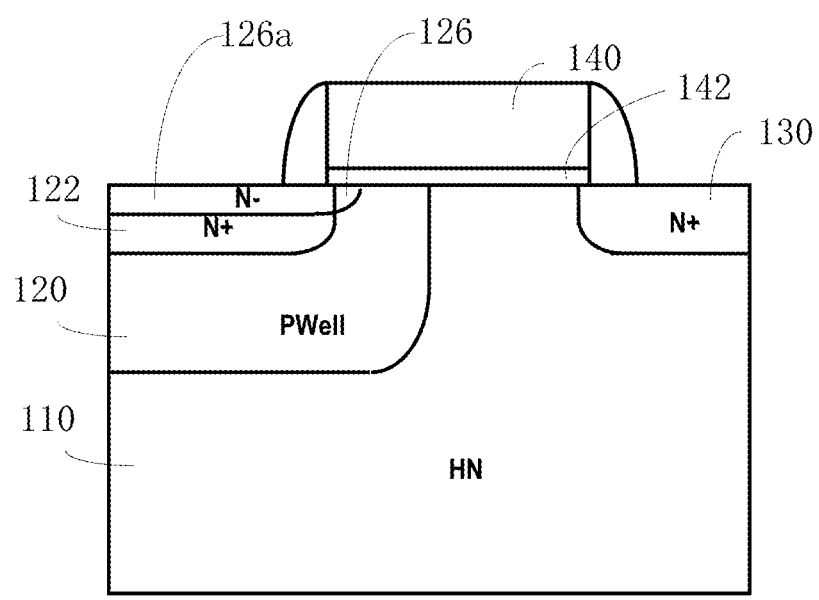
FIG. 2 is a schematic cross-sectional view of the semiconductor device shown in FIG. 1.
Figure 3:
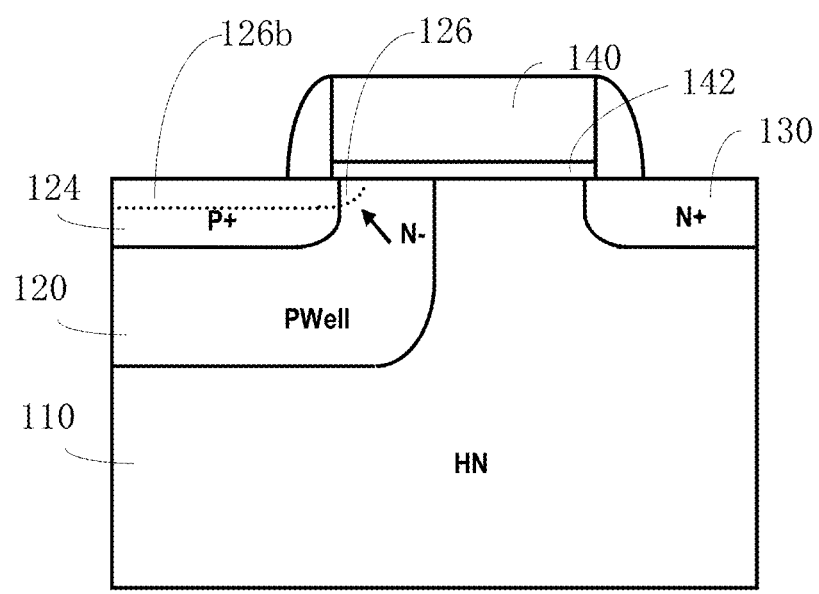
FIG. 3 is a schematic cross-sectional view of the semiconductor device shown in FIG. 1 in another position.

FIG. 1 is a schematic planar view of a semiconductor device in an embodiment, and FIGS. 2 and 3 are schematic cross-sectional view of FIG. 1 in two different positions, respectively. Referring to FIGS. 1, 2 and 3, in this embodiment, a semiconductor device includes a substrate, a well region 120, a source region 122, a body lead-out region 124, and a conductive auxiliary region 126. In the illustrated embodiment shown in FIG. 1, a high-voltage well region 110 is further formed in the substrate. The well region 120 is formed in the high-voltage well region 110. The well region 120 has a second conductivity type. The source region 122 is provided in the well region 120 and has a first conductivity type. The body lead-out region 124 is provided in the well region 120 and has the second conductivity type. In an embodiment, the semiconductor device is an N-channel device, with the first conductivity type being N-type, and the second conductivity type being P-type. In other embodiments, the semiconductor device may also be a P-channel device, with the first conductivity type being P type, and the second conductivity type being N type.

Referring to FIG. 1, the source regions 122 and the body lead-out regions 124 are alternately arranged in a width direction of a conductive channel, so as to form a first region extending along the width direction of the conductive channel. Both sides of the first region are boundaries formed by alternately arranging edges of the source regions 122 and edges of the body lead-out regions 124. The conductive auxiliary region 126 has the first conductivity type, and is provided on at least one side of the first region, e.g., on a right side of the first region as shown in FIG. 1. In FIG. 1, the conductive auxiliary region 126 is in direct contact with a boundary on the right side of the first region. The contacting portion includes at least one edge of the source region 122 on the boundary and at least one edge of the body lead-out region 124 on the boundary.

In the aforementioned semiconductor device, the source regions 122 and the body lead-out regions 124 are alternately arranged in the width direction of the conductive channel, which can reduce a size of the device in a length direction of the conductive channel. In addition, by providing the conductive auxiliary region 126 on a side of the source region 122 and the body lead-out region 124, conductive current can flow to the source region through the conductive auxiliary region 126, which optimizes a current path of the device and compensates for current loss caused by the presence of the body lead-out region of the second conductivity type, thus reducing a Rdson of the device.

In an embodiment, the semiconductor device further includes a drain region 130 and a gate 140. The first region is located on one side of the gate 140. The drain region 130 is located on the other side of the gate 140. In an embodiment, the gate 140 is a polysilicon gate. An insulating layer 142 is further provided below the polysilicon gate. In an embodiment, the material of the insulating layer 142 is silicon oxide, such as silicon dioxide.

In an embodiment, the conductive auxiliary region 126 is located below the polysilicon gate and the insulating layer 142.

In an embodiment, a doping concentration of the conductive auxiliary region 126 is less than a doping concentration of the source region 122. In the illustrated embodiment shown in FIG. 1, the conductive auxiliary region 126 is an N− region, and the source region 122 is an N+ region.

In an embodiment, the source region 122 is an N-type heavily doped (NSD) region. The body lead-out region 124 is a P-type heavily doped (PSD) region.

In the embodiment shown in FIG. 1, the high-voltage well region 110 is a high-voltage N-well (HN).

In order to simplify manufacturing process, in an embodiment, the conductive auxiliary region 126 and the well region 120 are performed using the same photolithography mask. That is, the conductive auxiliary region 126 and the well region 120 are both formed by performing an ion implantation through an implantation window formed by photoetching the photolithography mask, and then the conductive auxiliary region 126 and the well region 120 are formed (thermal diffusion can be performed after implantation, and the implanted ions form the conductive auxiliary region 126/well region 120 after the thermal diffusion). For example, after forming the implantation window by photoetching the photolithography mask, ions of the second conductivity type are implanted first to form the well region 120, and then ions of the first conductivity type are implanted to form the conductive auxiliary region 126. As a result, the step of implanting the ions of the first conductivity type will inevitably form a doped region of the first conductivity type in a larger region (because its size is determined by the implantation window of the well region 120, and the well region 120 is larger). For ease of description, a region corresponding to the doped region of the first conductivity type is denoted as a second region hereafter. The second region will partially overlap the source region 122 and the body lead-out region 124. Referring to FIGS. 2 and 3, a portion of the second region overlaps the source region 122 is a region 126a, and a portion of the second region overlaps the body lead-out region 124 is a region 126b, a portion located outside the first region is the conductive auxiliary region 126. A doping concentration of the ions of the first conductivity type in the region 126a will be different from a doping concentration of the ions of the first conductivity type in other portions of the source region 122. A doping concentration of the irons of the first conductivity type in the region 126b will be different from a doping concentration of the irons of the first conductivity type in other portions of the body lead-out region 124. However, since the second region is implanted with a lower concentration, it will not significantly affect the electrical properties inside the source region 122 and the body lead-out region 124.

In an embodiment, the ions of the first conductivity type are implanted to form the conductive auxiliary region 126, with an implantation energy between 15 keV to 50 keV. In an embodiment, the implanted ions are arsenic (As) ions.

Figure 4:
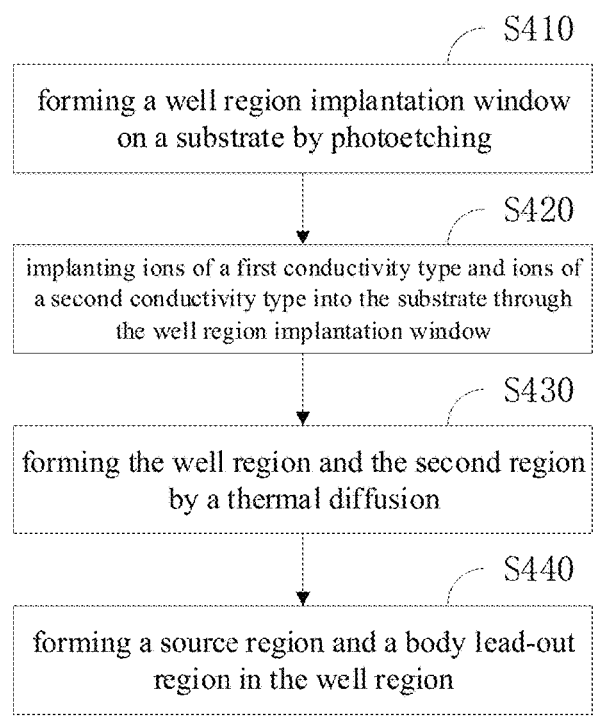
FIG. 4 is a flowchart of a method for manufacturing a semiconductor device in an embodiment.

It is also necessary to provide a method for manufacturing a semiconductor device, which can be used to manufacture the semiconductor device of any of the above embodiments. FIG. 4 is a flowchart of a method for manufacturing a semiconductor device in an embodiment, which includes the following steps:

S410, a well region implantation window is formed on a substrate by photoetching.

A well region photolithography mask is used to form the implantation window by photoetching. In an embodiment, a high-voltage well region, for example, a high-voltage N-well, may be formed on the substrate first, and then step S410 may be performed.

S420, ions of a first conductivity type and ions of a second conductivity type are implanted into the substrate through the well region implantation window.

The implanted ions of the second conductivity type are used to form a well region. The implanted ions of the first conductivity type are used to form a second region. In an embodiment, the semiconductor device is an N-channel device, with the first conductivity type being N-type, and the second conductivity type being P-type. In other embodiments, the semiconductor device may also be a P-channel device, with the first conductivity type being P type, and the second conductivity type being N type.

S430, the well region and the second region are formed by a thermal diffusion.

In step S420, the implanted ions of the second conductivity type are thermally diffused to form the well region, and the implanted ions of the first conductivity type are thermally diffused to form the second region. In an embodiment, both of the well region and the second region are formed in a high-voltage well region.

S440, a source region and a body lead-out region are formed in the well region.

The source regions and the body lead-out regions are alternately arranged in a width direction of a conductive channel, so as to form a first region extending along the width direction of the conductive channel. Both sides of the first region are boundaries formed by alternately arranging edges of the source regions and edges of the body lead-out regions. The first region overlaps a portion of the second region. A portion of the second region located outside the first region is used as a conductive auxiliary region. A portion of the conductive auxiliary region in direct contact with the boundary includes at least one edge of the source region on the boundary and at least one edge of the body lead-out region on the boundary.

In the above method for manufacturing the semiconductor device, the implantation in the conductive auxiliary region uses the same implantation window as the well region. That is, the implantation window formed after photoetching the well region is used not only for the implantation in the well region, but also for the implantation in the conductive auxiliary region. There is no need to increase photolithography mask for the formation of the conductive auxiliary region, which is beneficial to control the manufacturing cost.

In an embodiment, prior to step S410, the method further includes a step of forming a polysilicon layer on the substrate and etching the polysilicon layer to form a polysilicon gate. The ion implantation of the first conductivity type in S420 uses a smaller implantation energy. This implantation does not penetrate the polysilicon layer into the underlying substrate. In an embodiment, the implantation energy is between 15 keV to 50 keV. In an embodiment, the implanted ions are arsenic (As) ions. The conductive auxiliary region is diffused along a length direction of the conductive channel by the thermal diffusion until the conductive auxiliary region is below the etched polysilicon layer, for example, below the polysilicon gate.

In an embodiment, step S440 includes photoetching and forming the source region and the body lead-out region by the ion implantation, which specifically includes implanting the ions of the first conductivity type to form the source region, and implanting the ions of the second conductivity type to form the body lead-out region.

The inventor has found in actual manufacturing that, sometimes the conduction characteristics of the device may have problems. Through experimental research, the inventor believes that the problem of the conduction characteristic is caused by that a parasitic NPN transistor is turned on in the source region and the body lead-out region of the first region. In addition, the inventor believes that one of the reasons that causes the parasitic NPN transistor to be turned on is that an actual implantation amount in the body lead-out region is less than a designed implantation amount.

Figure 5:
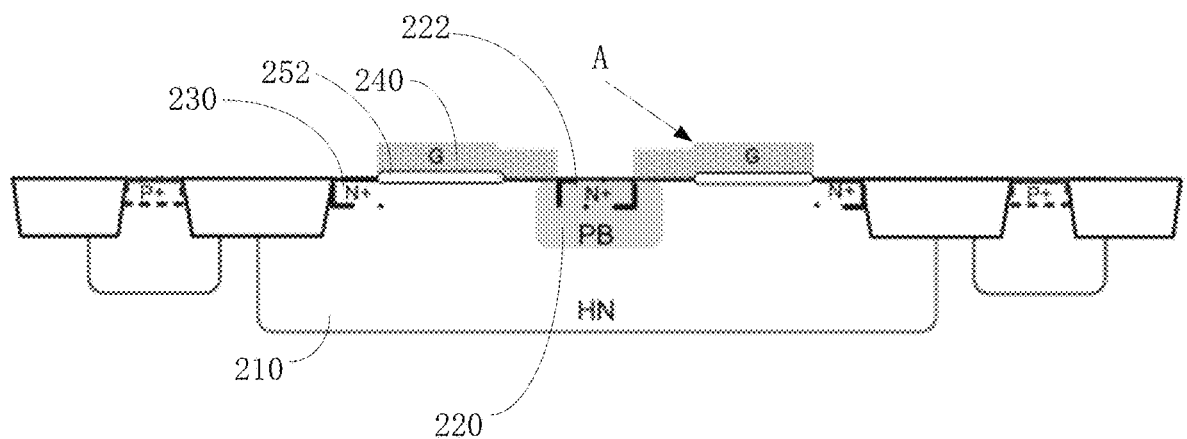
FIG. 5 is a schematic view of a polysilicon of a semiconductor device forming a step at an edge of an insulating layer.

Referring to FIG. 5, there is an insulating layer 252 with a certain thickness below a gate 240 serving as a field plate. Since the polysilicon of the gate 240 extends beyond an edge on a side of the insulating layer 252 to the substrate, a height difference between the edge of the insulating layer 252 and the substrate will lead to the formation of step A here. For the embodiment in which the ion implantation is performed after photoetching to form the source region 222 and the body lead-out region (not shown in FIG. 5) in step S440, after applying a photoresist in this photoetching step, the photoresist will cover the gate 240, and then the photoresist will also form a step at portion A. This step will cause exposure light to be refracted at the step of the photoresist during the exposure in the photoetching step. The refracted exposure light will also affect the regions that we do not want to develop, such that the implantation window of step S440 is deformed. Specifically, for the embodiment in which the photoresist is a positive resist, the refraction at the step of the photoresist will cause the exposure light to irradiate the photoresist in the body lead-out region, which will cause a reduced area covered by the photoresist that is originally blocked at the body lead-out region, such that the implantation area of the source region is increased, and the implantation area of the body lead-out region is reduced. The reduction in the implantation area of the body lead-out region is equivalent to the reduction of the total implantation amount of the body lead-out region, which will cause the aforementioned parasitic NPN to be turned on, thereby affecting the conduction characteristics of the device.

Figure 6:
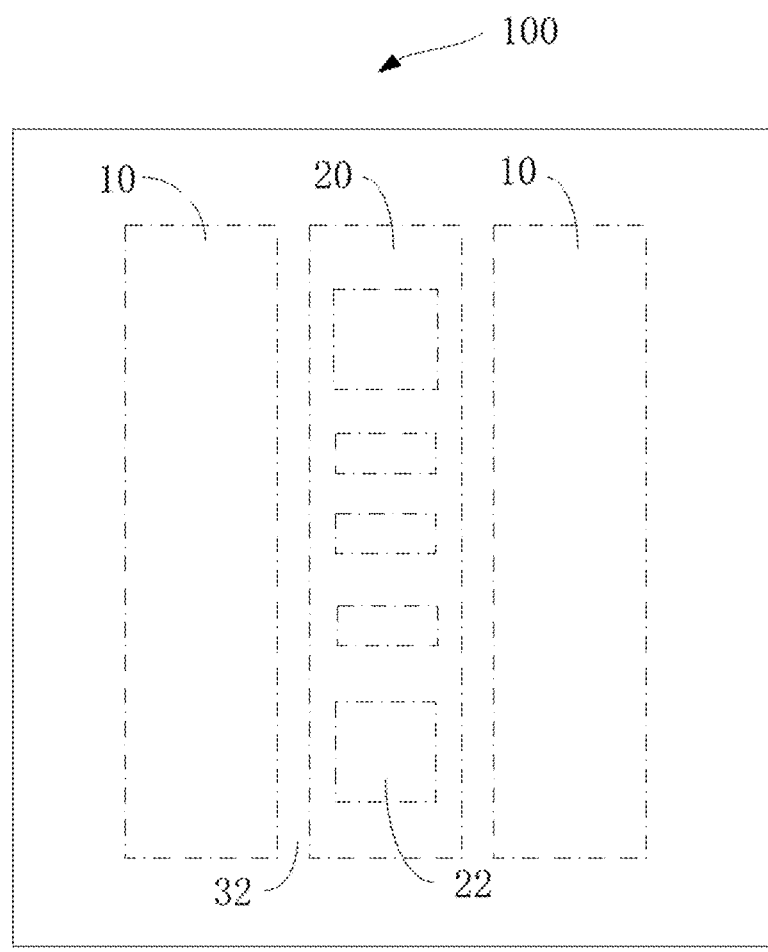
FIG. 6 is a structural view of a N+ photolithography mask in an embodiment.

In order to solve this problem, the inventor redesigned a layout of the device. Specifically, the photolithography mask used for the ion implantation in the source region in step S440 is redesigned. Referring to FIG. 6, an N+ photolithography mask 100 includes a first implantation region 20 and a second implantation region 10 that are separated from each other. The photolithography mask is used for a positive resist. The first implantation region 20 and the second implantation region 10 are light-transmitting regions of the photolithography masks. The N+ photolithography mask 100 further includes a light shielding region 32 located between the first implantation region 20 and the second implantation region 10. The first implantation region 20 is used to form the source region, and the second implantation region 10 is used to form the drain region. The first implantation region 20 includes a plurality of PSD regions 22. The PSD regions 22 are also light shielding regions of the photolithography mask. After photoetching using the N+ photolithography mask 100, the PSD region 22 will cause photoresist to block the body lead-out region, so as to prevent the implantation of the ions of the first conductivity type.

Figure 7:
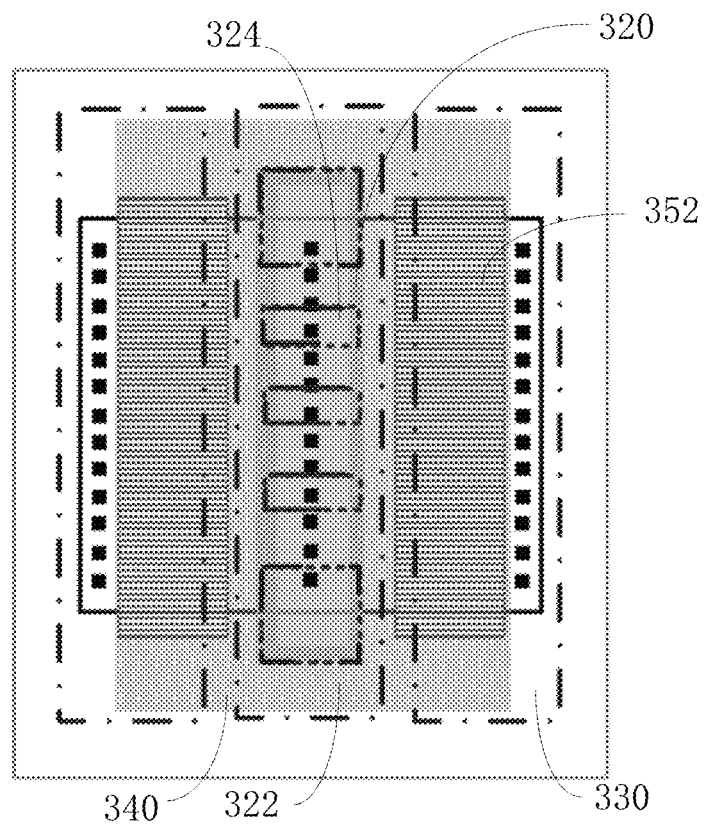
FIG. 7 is a layout of a semiconductor device in an embodiment.

FIG. 7 is a layout of a corresponding semiconductor device. Referring to FIGS. 5, 6, and 7, all of FIGS. 5, 6, and 7 show a left-right symmetrical (axisymmetric) structure. A region 340 in FIG. 7 corresponds to the gate 240 in FIG. 5. A region 330 in FIG. 7 corresponds to a drain region 230 in FIG. 5. A region 322 in FIG. 7 corresponds to the source region 222 in FIG. 5. A region 320 in FIG. 7 corresponds to a well region 220 in FIG. 5. A region 352 in FIG. 7 corresponds to the insulating layer 252 in FIG. 5. In addition, the region 330 in FIG. 7 corresponds to the second implantation region 10 in FIG. 6. The region 322 in FIG. 7 corresponds to the first implantation region 20 in FIG. 6. A region 324 corresponds to the PSD region 22. The semiconductor device shown in FIG. 5 is an N-channel semiconductor device. A high-voltage well region (RN) 210 is further formed in the substrate. The drain 230 is an N+ drain and is an N-type heavily doped (NSD) region. The source 222 is an N+ source and is an N-type heavily doped (NSD) region. The well region 220 is a P-type doped (PB) region. The gate 240 includes a polysilicon gate.

Since the N+ photolithography mask 100 is provided with the light shielding region 32 between the first implantation region 20 and the second implantation region 10, during photolithography exposure, the light shielding region 32 will prevent exposure light from radiating the step of the photoresist (which is located above the step A in FIG. 5), so as to avoid light refraction at the step of the photoresist, and the reduction of the implantation area of the body lead-out region is avoided, thereby ensuring the conduction characteristics and self-protection capabilities of the device.

Figure 8:
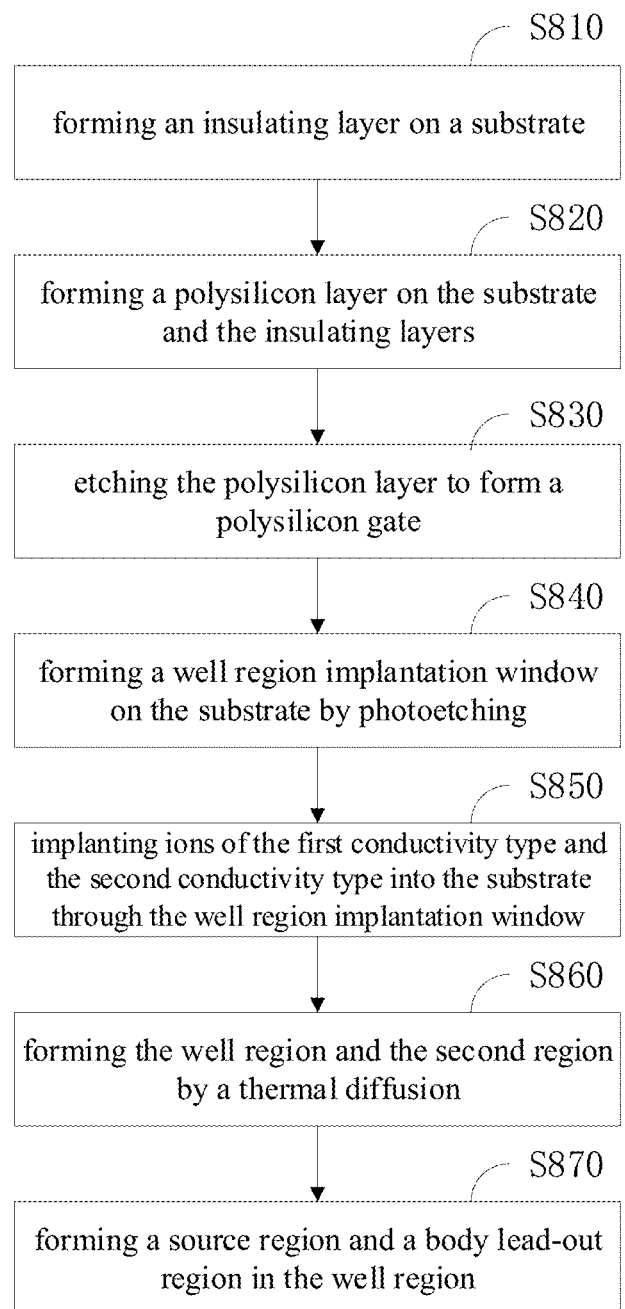
FIG. 8 is a flowchart of a method for manufacturing a semiconductor device in another embodiment.

FIG. 8 is a flowchart of a method of manufacturing a semiconductor device in another embodiment, which includes the steps:

S810, an insulating layer is formed on a substrate.

In an embodiment, the insulating layer is made of silicon oxide, such as silicon dioxide.

S820, a polysilicon layer is formed on the substrate and the insulating layers.

The polysilicon layer can be formed by a deposition process.

S830, the polysilicon layer is etched to form a polysilicon gate.

In addition to the polysilicon gate, a polysilicon field plate may further be formed. In the embodiment shown in FIG. 5, a part of the remaining the polysilicon after completing the etching is located on the insulating layer 252, and a part of the remaining the polysilicon extends beyond the edge on a side of the insulating layer 252 to the substrate, thereby forming a step A at the edge of the insulating layer.

S840, a well region implantation window is formed on the substrate by photoetching.

In an embodiment, prior to step S840, a high-voltage well region, for example, a high-voltage N-well, may be formed on the substrate.

S850, ions of the first conductivity type and the second conductivity type are implanted into the substrate through the well region implantation window.

The implanted ions of the second conductivity type are used to form the well region. The implanted ions of the first conductivity type are used to form the second region.

S860, the well region and the second region are formed by a thermal diffusion.

In step S860, the implanted ions of the second conductivity type are thermally diffused to form the well region, and the implanted ions of the first conductivity type are thermally diffused to form the second region. In an embodiment, both of the well region and the second region are formed in the high-voltage well region.

S870, a source region and a body lead-out region are formed in the well region.

In one embodiment, after the implantation window is formed by photoetching, the source region and the body lead-out region are respectively formed by the ion implantation.

After being applied, the photoresist covers the gate 240, and thus it is easy to form a step of the photoresist at the step A. In this step, the N+ photolithography mask 100 is photoetched, and the light shielding region 32 will prevent the exposure light from irradiating the step of the photoresist, to avoid the light refraction at the step of the photoresist, and to avoid the reduction of the implantation area of the body lead-out region, thereby ensuring the conduction characteristics and self-protection capabilities of the device.

The source regions and the body lead-out regions are alternately arranged in the width direction of the conductive channel to form the first region extending along the width direction of the conductive channel. The both sides of the first region are boundaries formed by alternately arranging edges of the source regions and edges of the body lead-out regions. The first region overlaps a portion of the second region. A portion of the second region located on the side outside the first region is used as the conductive auxiliary region. A portion of the conductive auxiliary region in direct contact with the boundary includes at least one edge of the source region on the boundary and at least one edge of the body lead-out region on the boundary.

Only several implementations of the present disclosure are illustrated in the aforementioned embodiments, and the description thereof is relatively specific and detailed, but it should not be understood as a limitation on the scope of the present disclosure. It should be noted that for those of ordinary skill in the art, without departing from the concept of the present disclosure, several modifications and improvements can be further made, which all fall within the protection scope of the present disclosure. Therefore, the protection scope of the present disclosure shall be subject to the appended claims.

What is claimed is:

1. A method for manufacturing a semiconductor device, comprising:
    forming a well region implantation window on a substrate by photoetching; implanting ions of a first conductivity type and ions of a second conductivity type into the substrate through the well region implantation window, wherein the first conductivity type is opposite to the second conductivity type;
    performing a thermal diffusion such that the implanted ions of the second conductivity type forms a well region, and the implanted ions of the first conductivity type forms a second region; and
    forming a source region and a body lead-out region in the well region, wherein the source regions and the body lead-out regions are alternately arranged in a width direction of a conductive channel, so as to form a first region extending along the width direction of the conductive channel, both sides of the first region are boundaries formed by alternately arranging edges of the source regions and edges of the body lead-out regions, the first region overlaps a part of the second region, a portion of the second region located outside the first region is used as a conductive auxiliary region, the conductive auxiliary region and the first region are arranged in a length direction of the conductive channel, a portion of the conductive auxiliary region in direct contact with the boundary comprises at least one edge of the source region on the boundary and at least one edge of the body lead-out region on the boundary.

2. The method according to claim 1, wherein in the step of implanting ions of the first conductivity type into the substrate through the well region implantation window, an implantation energy is between 15 keV to 50 keV.

3. The method according to claim 1, wherein in the step of implanting ions of the first conductivity type into the substrate through the well region implantation window, the implanted ions are arsenic ions.

4. The method according to claim 1, wherein prior to the step of forming the well region implantation window on the substrate by photoetching, the method further comprises a step of forming a polysilicon layer on the substrate and etching the polysilicon layer to form a polysilicon gate.

5. The method according to claim 4, wherein prior to the step of forming the polysilicon layer on the substrate and etching the polysilicon layer to form the polysilicon gate, the method further comprises a step of forming an insulating layer on the substrate, a part of the remaining polysilicon after completing the etching is located on the insulating layer, and a part of the remaining polysilicon extends beyond an edge on a side of the insulating layer to the substrate;

wherein the step of forming the source region and the body lead-out region in the well region comprises performing photoetching using a first photolithography mask to form an ion implantation window of the first conductivity type, and then implanting the ions of the first conductivity type into the substrate through the ion implantation window of the first conductivity type, wherein the first photolithography mask comprises a first implantation region and a second implantation region that are separated from each other, the first implantation region and the second implantation region are light-transmitting regions, the first photolithography mask further comprises a light shielding region located between the first implantation region and the second implantation region, the first implantation region is configured to form the source region, and the second implantation region is configured to form a drain region.

6. The method according to claim 4, further comprising a step of diffusing the conductive auxiliary region along a length direction of the conductive channel by the thermal diffusion, until the conductive auxiliary region is below the polysilicon gate.

7. The method according to claim 5, wherein in the step of performing the photoetching using the first photolithography mask, an applied photoresist forms a step above an edge on a side of the insulating layer, the light shielding region is configured to prevent exposure light from radiating the step during photolithography exposure.

8. The method according to claim 5, wherein in the step of performing the photoetching using the first photolithography mask, a used photoresist is a positive resist.

* * * * *